United States Patent
Ito et al.

(10) Patent No.: US 9,717,152 B2
(45) Date of Patent: Jul. 25, 2017

(54) DISPLAY APPARATUS AND BASE

(75) Inventors: Tadayuki Ito, Tokyo (JP); Yoshihito Mochizuki, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 24 days.

(21) Appl. No.: 14/241,044

(22) PCT Filed: Aug. 31, 2011

(86) PCT No.: PCT/JP2011/069808
§ 371 (c)(1),
(2), (4) Date: Feb. 25, 2014

(87) PCT Pub. No.: WO2013/030994
PCT Pub. Date: Mar. 7, 2013

(65) Prior Publication Data
US 2014/0233202 A1    Aug. 21, 2014

(51) Int. Cl.
*H05K 5/02* (2006.01)
*H05K 5/00* (2006.01)
*F16M 13/02* (2006.01)

(52) U.S. Cl.
CPC ......... *H05K 5/0217* (2013.01); *F16M 13/022* (2013.01); *H05K 5/0017* (2013.01); *F16M 2200/08* (2013.01)

(58) Field of Classification Search
CPC .. H05K 5/0217; H05K 5/0017; H05K 7/0217; F16M 13/022; F16M 2200/08; F16M 11/36; A47B 91/005
USPC ...... 361/679.53, 807, 679.22, 679.21, 679.9, 361/679.59, 681, 808; 248/188.8, 346.01, 248/917, 920, 687, 688
See application file for complete search history.

(56) References Cited

U.S. PATENT DOCUMENTS

| | | | |
|---|---|---|---|
| 3,937,491 A * | 2/1976 | Hilding | B42D 5/005 281/44 |
| 6,511,039 B1 * | 1/2003 | Nash | A47B 21/0314 248/346.07 |
| 8,188,974 B2 * | 5/2012 | Bidiville | G06F 3/03543 345/156 |
| 2005/0105257 A1 * | 5/2005 | Shimizu | F16M 11/046 361/679.08 |

(Continued)

FOREIGN PATENT DOCUMENTS

| | | |
|---|---|---|
| JP | 2002-162911 A | 6/2002 |
| JP | 2002-296678 A | 10/2002 |
| JP | 2007-241627 A | 9/2007 |

OTHER PUBLICATIONS

International Search Report in PCT/JP2011/069808 dated Nov. 8, 2011 (English Translation Thereof).

*Primary Examiner* — Jayprakash N Gandhi
*Assistant Examiner* — Stephen Sul
(74) *Attorney, Agent, or Firm* — McGinn IP Law Group, PLLC.

(57) ABSTRACT

A display apparatus has a friction surface which makes friction force between a base and a support surface on a lower surface of the base that supports the display body, in which the friction surface has a high friction surface having a relatively high friction coefficient and a low friction surface having a lower friction coefficient than that of the high friction surface, and the low friction surface protrudes further than the high friction surface.

19 Claims, 9 Drawing Sheets

(56) References Cited

U.S. PATENT DOCUMENTS

| | | | |
|---|---|---|---|
| 2005/0121583 A1* | 6/2005 | Cavello | A47B 49/00 248/349.1 |
| 2007/0000086 A1* | 1/2007 | Cheng | A47B 21/0314 16/42 R |
| 2008/0142676 A1* | 6/2008 | Hobden | G01C 9/02 248/687 |
| 2010/0149752 A1* | 6/2010 | Lian | G06F 1/1616 361/679.59 |
| 2011/0279962 A1* | 11/2011 | Chiang | F16M 11/105 361/679.21 |

\* cited by examiner

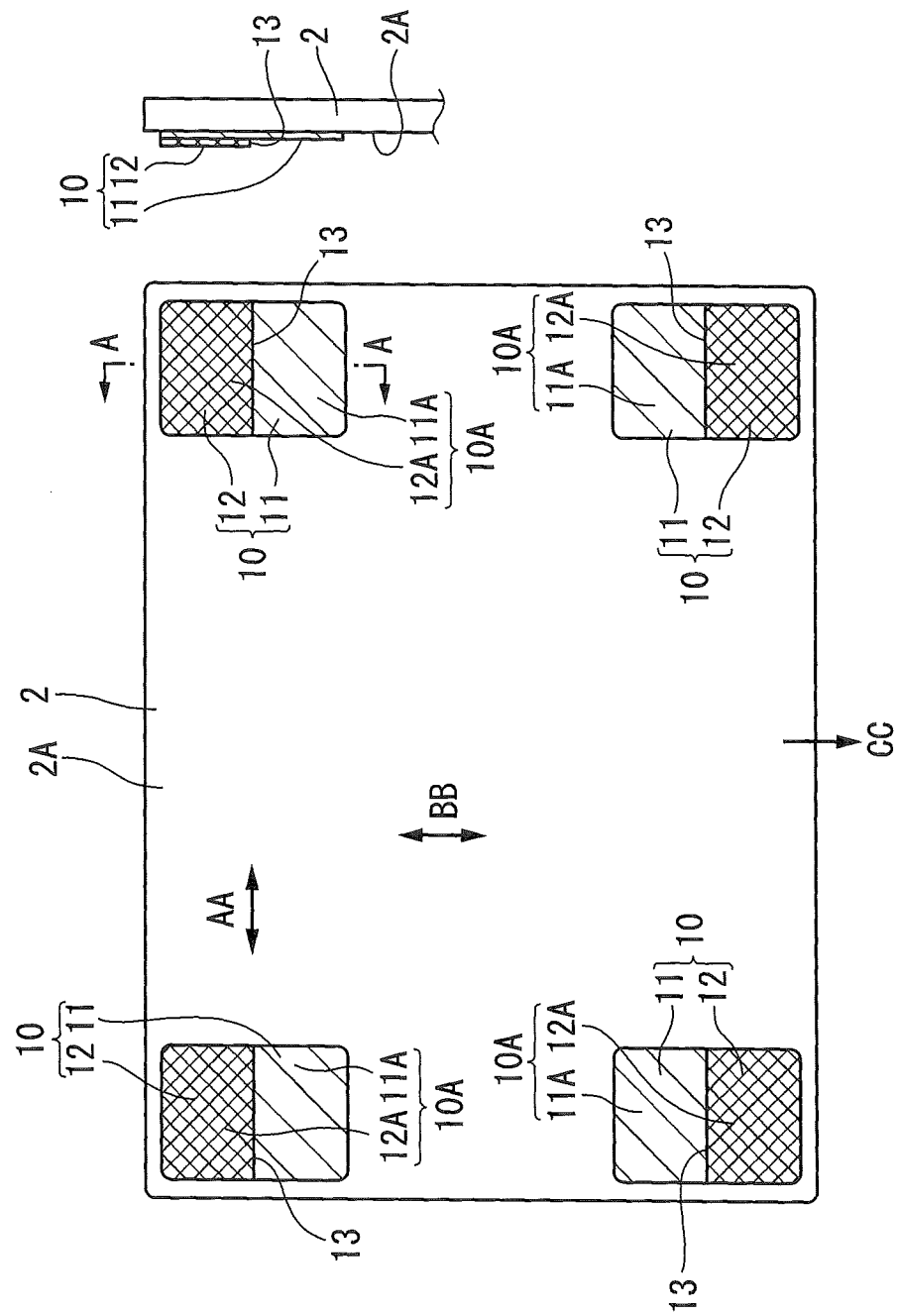

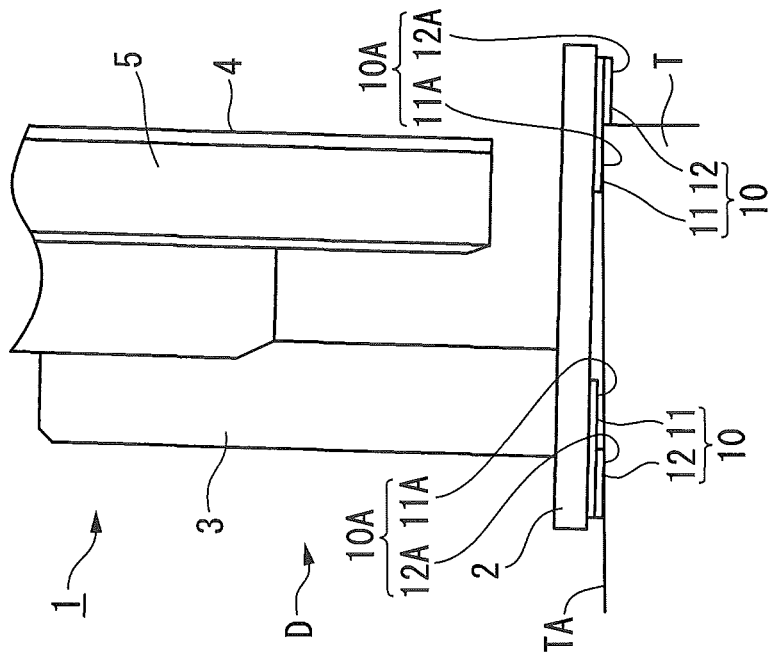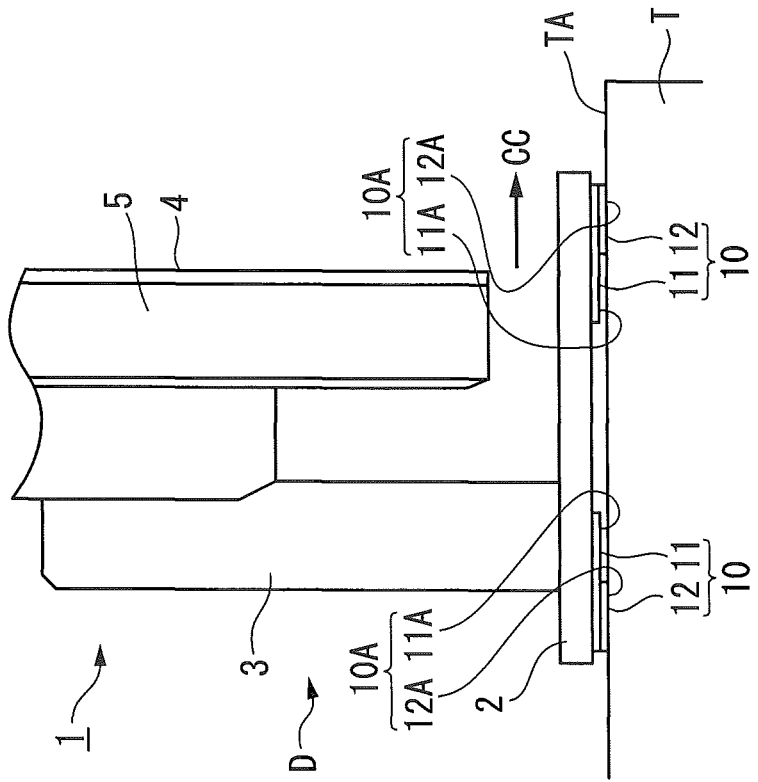

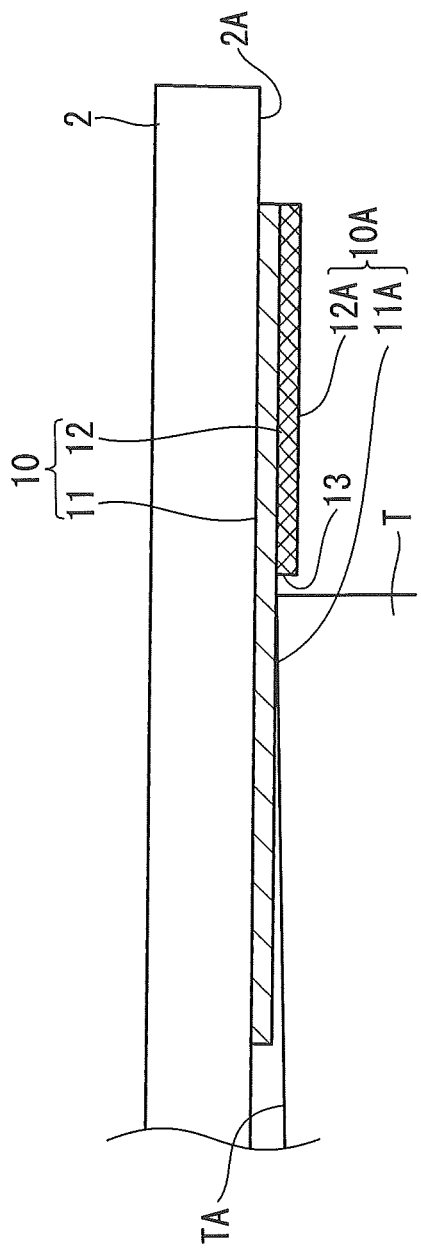

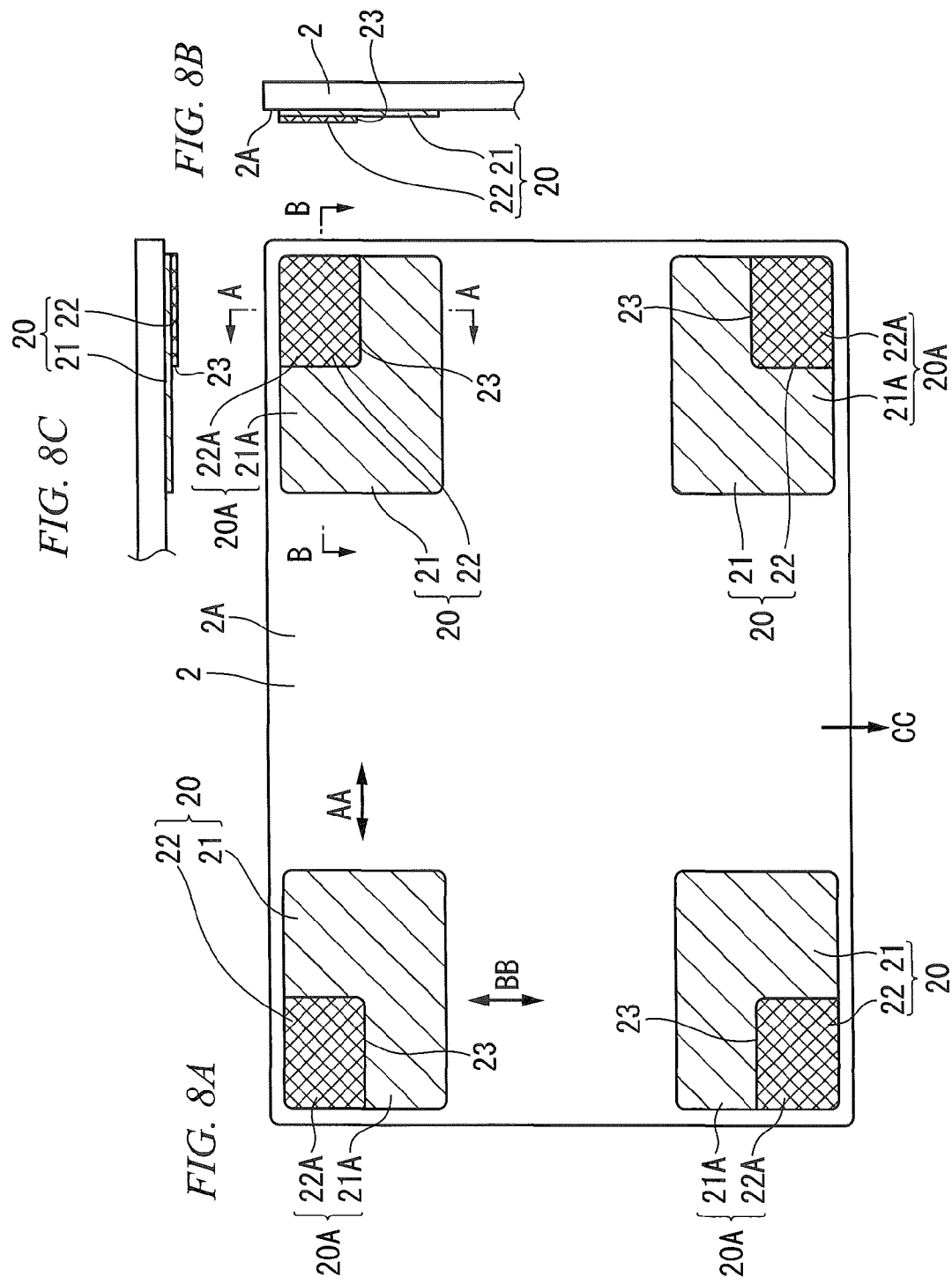

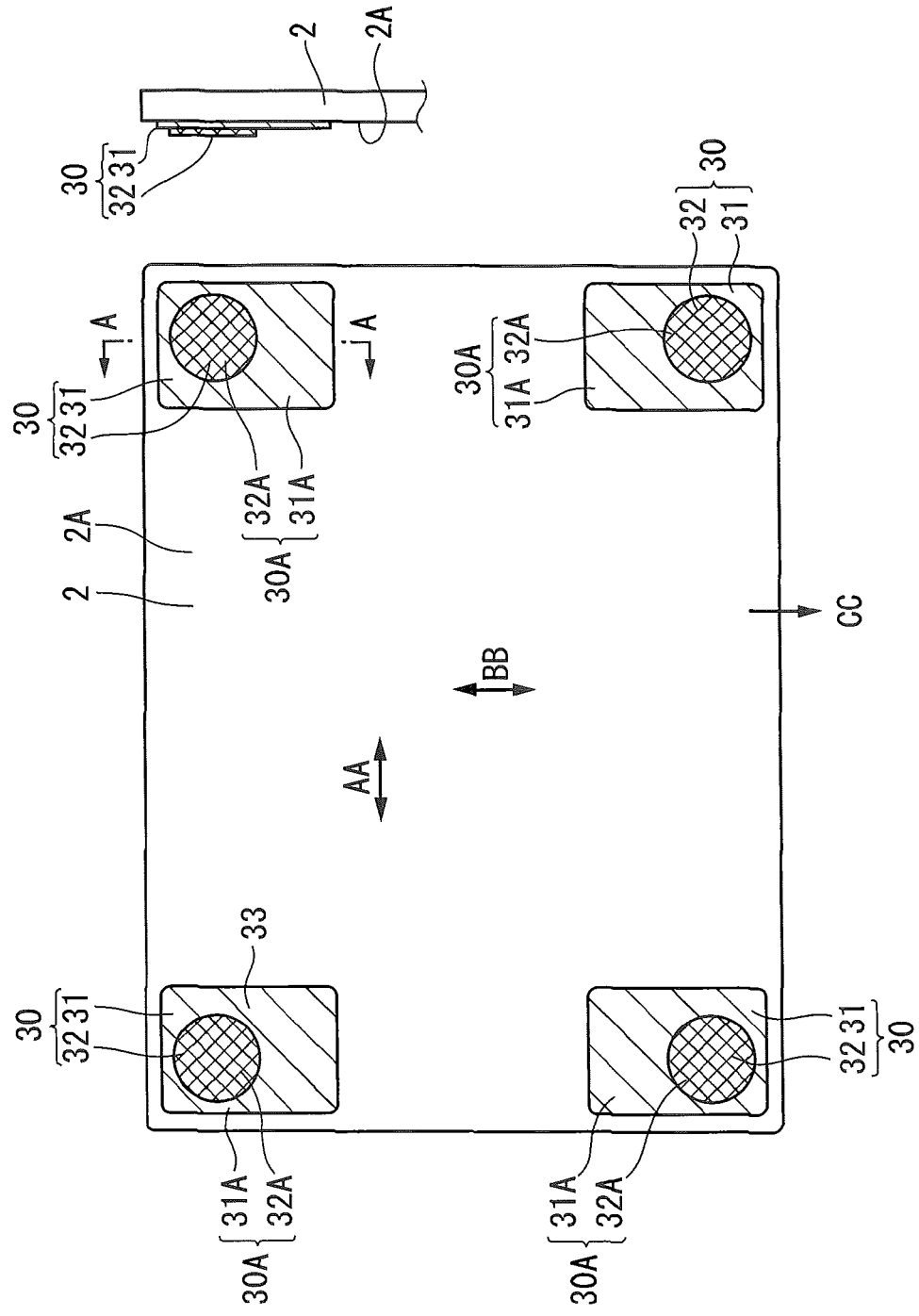

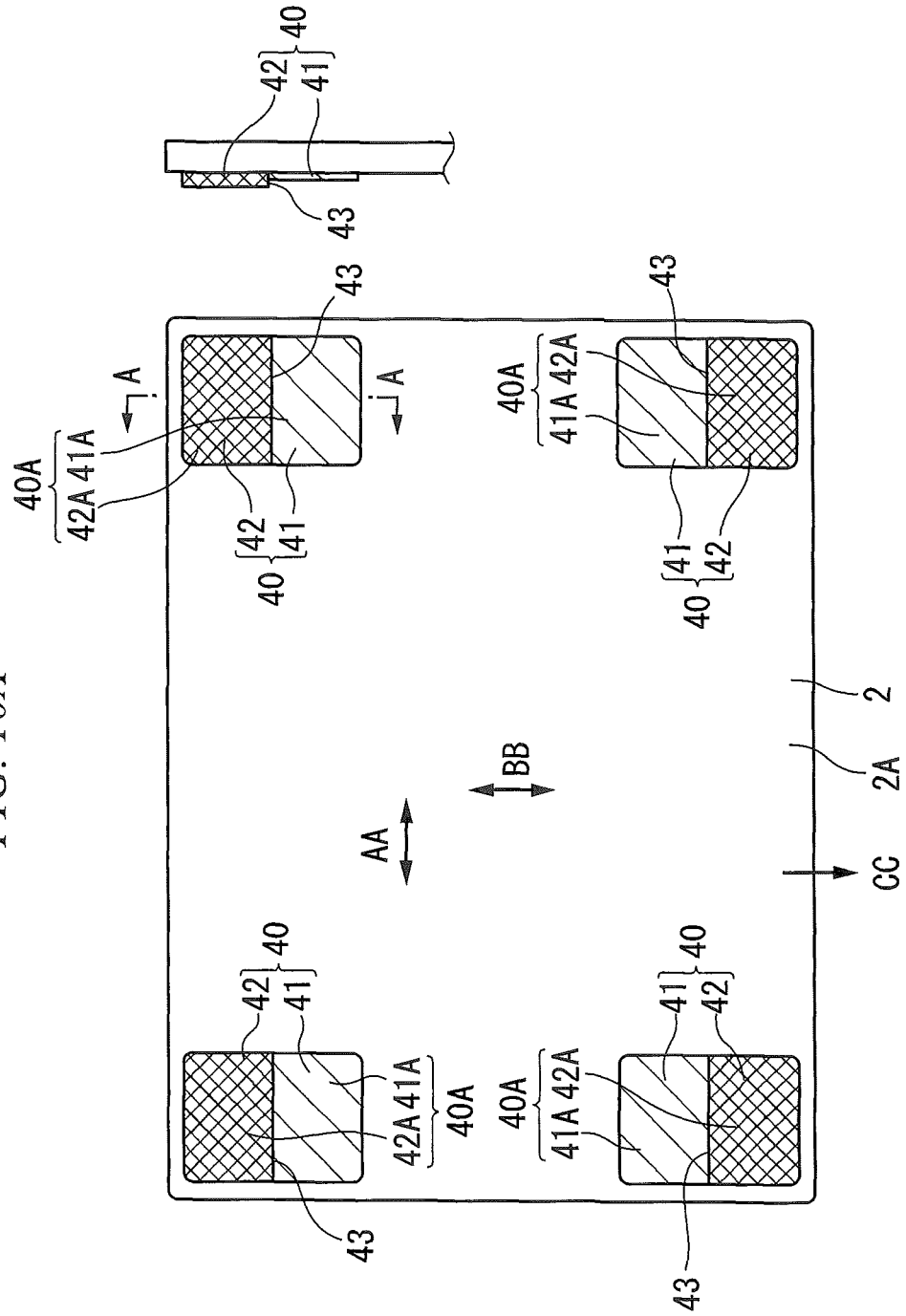

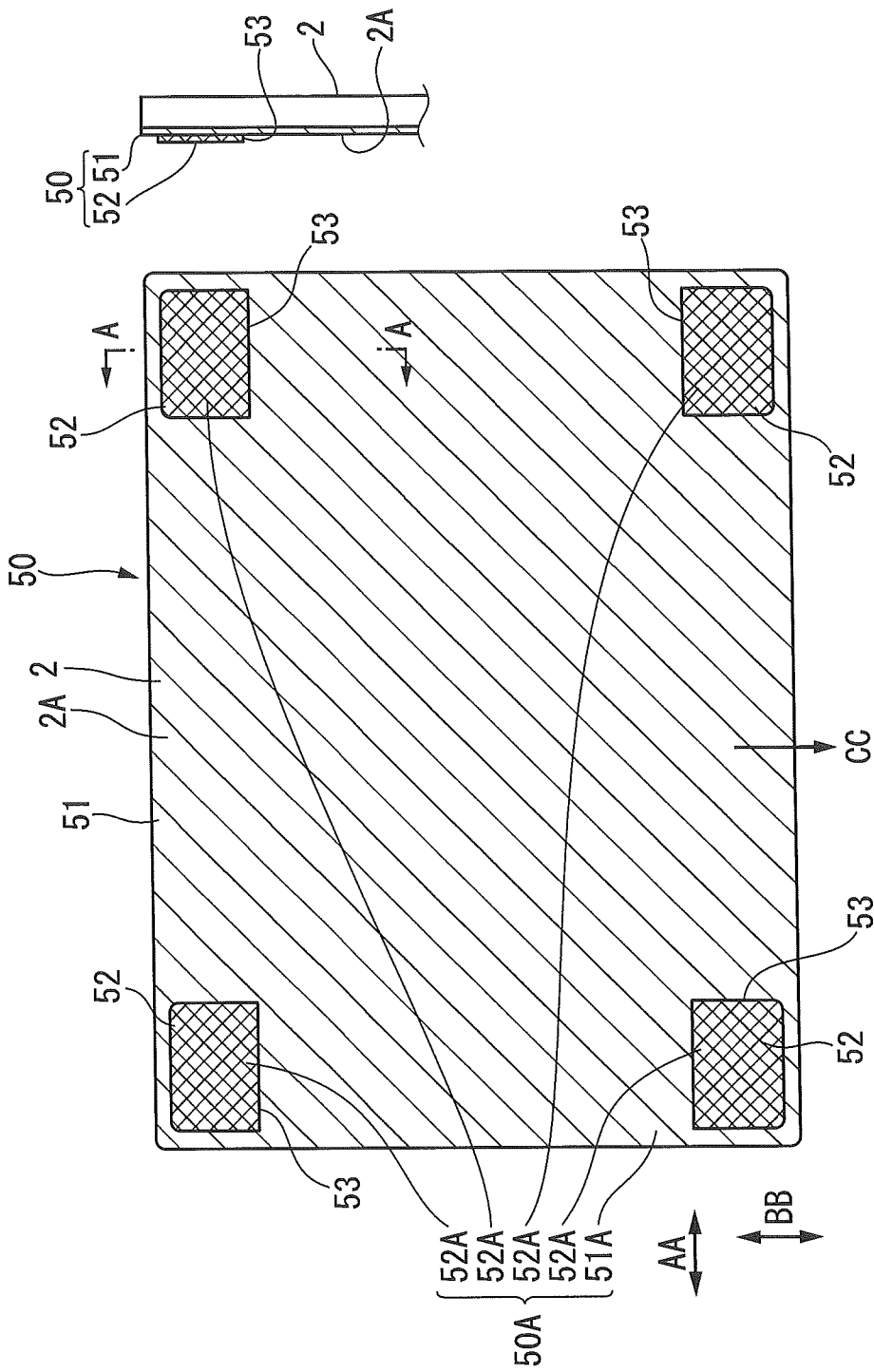

DISPLAY APPARATUS AND BASE

TECHNICAL FIELD

The present invention relates to technology, which is applied to a display apparatus, for preventing the display apparatus placed on a desk or the like from falling off from the desk due to external force.

BACKGROUND ART

In the related art, a placement table disclosed in Patent Document 1 has been known as technology for preventing a display apparatus from falling off from a desk.

The placement table is configured by arranging a sliding member and a stopper for slip prevention on a bottom surface of a plate on which an electronic apparatus is placed and is configured to have an advancing and retreating mechanism for advancing and retreating one or both the sliding member and the stopper in a vertical direction by a manual operation, and for making the sliding member to protrude relative to the stopper during operation to fix only the sliding member to the desk, and for maintaining the stopper in a fixed state during non-operation. Moreover, in the placement table, it is possible to fix the placement table on an upper surface of the desk so as to prevent slipping of the plate on which the electronic apparatus is placed by operating the advancing and retreating mechanism and by grounding the stopper on the upper surface of the desk.

DOCUMENTS OF THE PRIOR ART

Patent Documents

[Patent Document 1] Japanese Unexamined Patent Application, First Publication No. 2007-241627

DISCLOSURE OF INVENTION

Problem to be Solved by the Invention

However, in the placement table disclosed in Patent Document 1, there is a concern that the placement table would slip down from the upper surface of the desk when a user forgets to operate the advancing and retreating mechanism.

In addition, in a state where the sliding member protrudes by the advancing and retreating mechanism, it is desirable to make the placement table slip on the upper surface of the desk for convenience when moving the electronic apparatus (display apparatus) on the upper surface of the desk. However, at this time, there is a concern that the placement table would fall off together with the electronic apparatus due to part of the sliding member being deviated from the desk in a case where too much external force is applied to the placement table so that the placement table moves excessively.

The invention was made in view of such circumstances, and an object of the invention is to provide a display apparatus and a base that can realize smooth movement on an upper surface of a desk and fall prevention from an edge of the upper surface of the desk while neither requiring any particular operation for generating friction force to the upper surface of the desk nor performing any operation relating to the generation of the friction force on the upper surface of the desk.

Means for Solving the Problem

In order to solve the problem described above, the invention proposes the following means.

That is, according to an exemplary embodiment of the invention, there is provided a display apparatus having a friction surface between a base and a support surface on a lower surface of the base that supports a display body, and the base thereof, in which the friction surface has a high friction surface having a relatively high friction coefficient and a low friction surface having a lower friction coefficient than that of the high friction surface, and the low friction surface protrudes further than the high friction surface.

Effects of the Invention

According to the present invention, the friction surface which makes the friction force between the base and the support surface is provided on the lower surface of the base that supports the display body, and the friction surface has a high friction surface having a relatively high friction coefficient and a low friction surface having a lower friction coefficient than that of the high friction surface, and there is a positional relationship that the low friction surface protrudes further than the high friction surface. Thus, in ordinary use, the low friction surface which is in a protruded position enters a state where the low friction surface comes into contact with the support surface on the desk. Moreover, in this state, it is possible to make the display body slide and move along the support surface on the desk through the low friction surface and to easily change the position or the direction of the display body.

In addition, when the display body enters a state where the display body moves to the edge of the desk and the low friction surface is projected from the edge of the desk, the high friction surface which is at a position much lower than the low friction surface comes into contact with the support surface on the desk instead of with the low friction surface. Accordingly, the display body is prevented from sliding on the support surface on the desk due to the high friction surface and the display body is prevented from falling off from the edge of the desk using the high friction surface as a stopper.

In addition, since either the low friction surface or the high friction surface comes in contact with the support surface on the desk by moving the display body on the desk, the particular manual operation as in the related art is unnecessary and there is no failure such as the falling off of the display apparatus from the desk due to a failure to perform the operation. That is, in the present invention having the simple configuration, it is possible to realize smooth movement on the upper surface of the desk and to prevent from falling off from the edge of the upper surface of the desk while not performing any operation relating to the generation of the friction force on the upper surface of the desk.

In addition, in the friction surface, by positioning the low friction surface outer than the high friction surface and by providing the low friction surface in the vicinity of the edge of the lower surface of the base, when the display body enters a state where the display body moves to the edge of the desk and the low friction surface is projected from the edge of the desk, the high friction surface which is at a position much lower than the low friction surface comes into contact with the support surface on the desk. As a result, the display body is prevented from sliding on the support surface on the desk due to the high friction surface and the display body can be reliably prevented from falling off from the edge of the desk.

In addition, it is possible to improve workability of the friction surface by forming a linear or curved step between the two friction surfaces configured to have the high friction surface and the low friction surface depending on the ease of the workability.

In addition, in a case where the direction of the step is almost perpendicular to the display surface of the display body, it is possible to prevent the display apparatus from falling off when the display body moves in a direction along the display surface (for example, lateral direction). In a case where the direction of the step is almost parallel to the display surface of the display body, it is possible to prevent the display apparatus from falling off when the display body moves in a direction perpendicular to the display surface (for example, forward direction).

In addition, it is possible to obtain the above-described state where the low friction surface protrudes further than the high friction surface by having a configuration that the low friction surface is provided to overlap on the high friction surface; that the entire lower surface of the base is formed with the high friction surface and that the low friction surface is provided to overlap on the high friction surface; or that the low friction surface is formed to be greater in thickness relative to the high friction surface and that the low friction surface and the high friction surface are disposed at a position adjacent to each other without overlapping each other. That is, it is possible to realize the above-described state where the low friction surface protrudes further than the high friction surface using various dispositions of the high friction surface and the low friction surface.

BRIEF DESCRIPTION OF THE DRAWINGS

FIG. 5A is a bottom surface view showing the lower surface of the base of the display apparatus shown in FIG. 1 and FIG. 5B is a cross-sectional view taken along line A-A of FIG. 5A.

FIGS. 6A and 6B are views for illustrating an effect of preventing the display apparatus shown in FIG. 1 from falling off, in which FIG. 6A is a view of the display apparatus when it is positioned on a desk in the vicinity of an edge and FIG. 6B is a view of the display apparatus when it protrudes from the edge on the desk.

FIG. 7 is an enlarged view showing a vicinity of a friction surface on the right side of FIG. 6B.

FIGS. 8A, 8B, and 8C are views showing Exemplary Embodiment 2 of the present invention, in which FIG. 8A is a bottom surface view showing a lower surface of a base of a display apparatus, FIG. 8B is a cross-sectional view taken along line A-A of FIG. 8A, and FIG. 8C is a cross-sectional view taken along line B-B of FIG. 8A.

FIGS. 9A and 9B are views showing Exemplary Embodiment 3 of the present invention, in which FIG. 9A is a bottom surface view showing a lower surface of a base of a display apparatus and FIG. 9B is a cross-sectional view taken along line A-A of FIG. 9A.

FIGS. 10A and 10B are views showing Exemplary Embodiment 4 of the present invention, in which FIG. 10A is a bottom surface view showing a lower surface of a base of a display apparatus and FIG. 10B is a cross-sectional view taken along line A-A of FIG. 10A.

FIGS. 11A and 11B are views showing Exemplary Embodiment 5 of the present invention, in which FIG. 11A is a bottom surface view showing a lower surface of a base of a display apparatus and FIG. 11B is a cross-sectional view taken along line A-A of FIG. 11A.

EXEMPLARY EMBODIMENTS FOR CARRYING OUT THE INVENTION

[Exemplary Embodiment 1]

Exemplary Embodiment 1 of the present invention will be described with reference to FIGS. 1 to 7.

Figure 1:
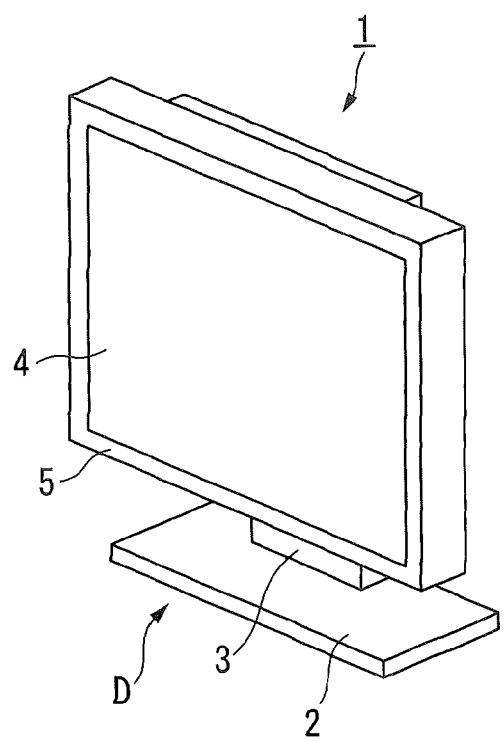
FIG. 1 is a perspective view showing a whole display apparatus to which the present invention is applied.
Figure 2:
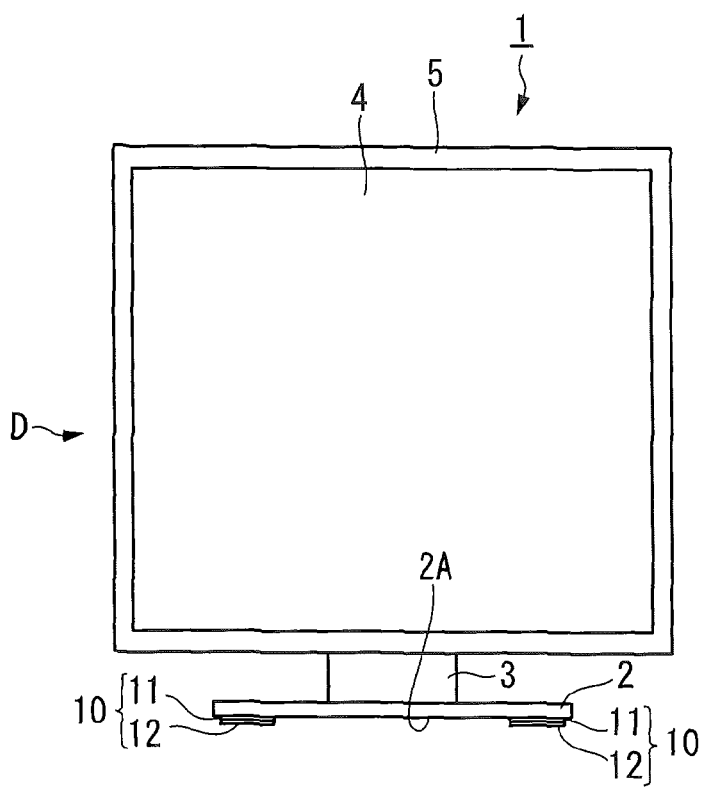
FIG. 2 is a front view of the display apparatus shown in FIG. 1.
Figure 3:
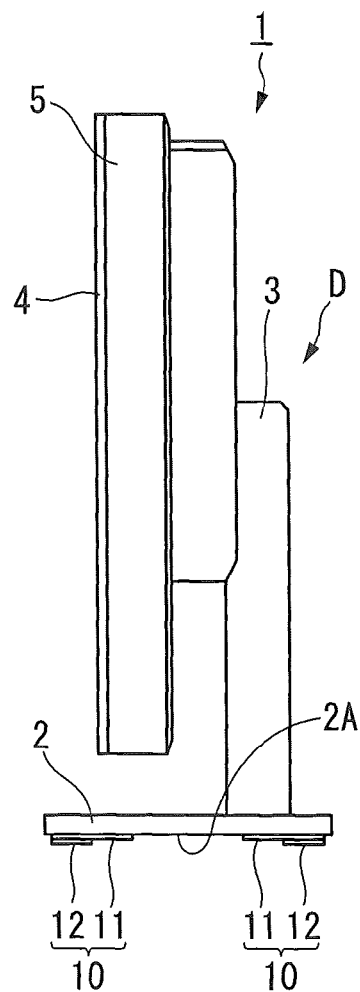
FIG. 3 is a side view of the display apparatus shown in FIG. 1.

FIGS. 1 to 3 are display apparatuses 1 to which the present invention is applied, including a display body D configured to have a base 2 placed on a support surface TA (refer to FIGS. 6 and 7) as an upper surface of a desk T; a leg part 3 which is made to stand on the base 2; and a display panel 5 which is provided on an upper end of the leg part 3 and has a display surface 4 on a front surface.

Figure 4:
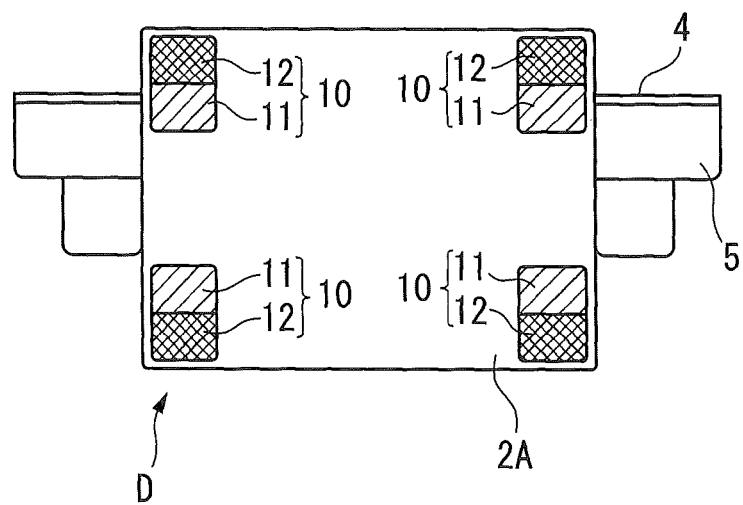
FIG. 4 is a bottom surface view showing a lower surface of a base of the display apparatus shown in FIG. 1.

In addition, as shown in FIGS. 4, 5A and 5B, a friction member 10 having a friction surface 10A which serves friction force between the base 2 and the support surface TA of the desk T is provided on a lower surface 2A of the base 2 that supports a display panel 5 of the display body D.

The friction member 10 is a layered body configured to have a high friction member 11 which is large and is stacked on the lower surface 2A of the base 2 and a low friction member 12 which has a (relatively) smaller size (than the high friction member 11) and is stacked on the high friction member 11.

The friction surface 10A of the friction member 10 includes a high friction surface 11A on the high friction member 11 having a relatively high friction coefficient and a low friction surface 12A on the low friction member 12 having a lower friction coefficient than that of the high friction surface. Moreover, the low friction surface 12A is configured to be protruded downward (toward the support surface TA) from the high friction surface 11A.

Specifically, as shown in FIGS. 4, 5A, and 5B, the friction surface 10A is configured such that the low friction surface 12A overlaps on the high friction surface 11A, and thus, the low friction surface 12A protrudes downward from the high friction surface 11A, and the friction surface 10A is positioned in a corner and in the vicinity of an edge of the lower surface 2A of the base 2. In addition, the low friction surface 12A is positioned on an outward side from the high friction surface 11A.

Moreover, in such a display apparatus 1, in ordinary use as shown in FIG. 6A, the low friction surface 12A positioned to be protruded enters a state where the low friction surface comes into contact with the support surface TA of the desk T. Moreover, in this state, it is possible to make the display body D slide and move along the support surface TA on the desk T through the low friction surface 12A and to easily change the position or the direction of the display body D.

In addition, as shown in FIGS. 6B and 7, when the display body D enters a state where the display body D moves to the edge of the desk T and the low friction surface 12A is projected from the edge of the desk T, the high friction surface 11A which is at a position much lower than the low friction surface 12A comes into contact with the support surface TA on the desk T, instead of with the low friction surface 12A. Accordingly, the display body D can be prevented from sliding on the support surface TA on the desk T due to the high friction surface 11A and the display body D can be reliably prevented from falling off from the edge of the desk T using the high friction surface 11A as a stopper.

In addition, a linear step 13 is provided between the two friction surfaces configured to have the high friction surface 11A and the low friction surface 12A.

As shown in FIGS. 5A and 5B, the step 13 is disposed to be almost parallel to the display surface 4 of the display body D (in the direction of arrow AA). Because the step 13 is disposed to be almost parallel to the display surface 4 of the display body D, in a case where the display body D moves in the direction of arrow BB perpendicular to the display surface 4 (for example, in a case where the display body moves forward as shown by arrow CC in FIG. 6A), it is possible to prevent the display body from falling off from the desk T. In other words, since the direction of the step difference of the step 13 is provided to be almost perpendicular to the display surface 4 of the display body D, it is possible to prevent the falling off from the desk T when the display body D moves in the direction.

A relatively high friction or low friction can be realized by adjusting the material of the high friction member 11 and the low friction member 12 of the friction member 10 by selecting the material such as rubber, plastic, or the like. In addition, various techniques such as processes using double-sided tape, adhesive, and the like are used for fixing the high friction member 11 on the lower surface 2A of the base 2 or fixing the low friction member 12 onto the high friction member 11.

In addition, the height of the step 13 is determined depending on the weight of the display body D. For example, since there is a concern that the high friction member 11 would be deformed depending on the weight of the display body D and the height of the step 13 becomes smaller, it is preferable that the height of the step 13 becomes higher as the weight of the display body D becomes greater. Since the height of the step 13 is 1 mm in the example, it is possible to apply the height of the step to many display main bodies.

In addition, although in total four friction members 10 are provided by disposing the friction members at four corners of the lower surface 2A of the base 2, the number of installed friction members may be appropriately changed depending on the weight of the display body D. For example, in a case where the weight of the display body D is small, three friction members may be provided by placing two on a front surface side and one in the center of a rear surface side.

As described above in detail, in the display apparatus 1 shown in this example, the friction surface 10A which makes friction force between the base 2 and the support surface TA is provided on the lower surface 2A of the base 2 that supports the display body D; the friction surface 10A includes a high friction surface 11A having a relatively high friction coefficient and a low friction surface 12A having a relatively lower friction coefficient than the high friction coefficient; and there is a position relation that the low friction surface 12A protrudes further than the high friction surface 11A. Therefore, in ordinary use, the low friction surface 12A positioned to be protruded enters a state where the low friction surface comes into contact with the support surface TA of the desk T. Moreover, in this state, it is possible to make the display body D slide and move along the support surface TA on the desk T through the low friction surface 12A and to easily change the position or the direction of the display body D. In addition, when the display body D enters a state where the display body moves to the edge of the desk T and the low friction surface 12A is projected from the edge of the desk T, the high friction surface 11A which is at a position much lower than the low friction surface 12A comes into contact with the support surface TA on the desk T instead of with the low friction surface 12A. Accordingly, the display body D is prevented from sliding on the support surface TA on the desk T due to the high friction surface 11A and the display body D is prevented from falling off from the edge of the desk T using the high friction surface 11A as a stopper.

In addition, since either the low friction surface 12A or the high friction surface 11A comes in contact with the support surface TA on the desk T by moving the display body D on the upper surface of the desk T, the particular manual operation as in the related art is unnecessary and there is no failure such as the falling off of the display apparatus due to the failure to perform operation. That is, in the present invention having the simple configuration, it is possible to realize smooth movement on the support surface TA of the desk T and fall prevention from the edge of the support surface TA of the desk T at the same time without performing any operation relating to the generation of friction on the support surface TA of the desk T.

In addition, in the friction surface 10A, by positioning the low friction surface 12A on an outward side from the high friction surface 11A and providing the low friction surface on the edge of the lower surface 2A of the base 2, when the display body D enters a state where the display body D moves to the edge of the desk T and the low friction surface 12A is projected from the edge of the desk T, the high friction surface 11A which is at a position much lower than the low friction surface 12A comes into contact with the support surface TA on the desk T. As a result, the display body D is prevented from sliding on the support surface TA on the desk T due to the high friction surface 11A and the display body D can be reliably prevented from falling off from the edge of the desk T.

In addition, it is possible to reliably prevent the display body D from falling off from the edge of the desk T by forming a linear step 13 between the two friction surfaces configured to have the high friction surface 11A and the low friction surface 12A depending on the shape of the edge of the desk T. Moreover, it is possible to prevent falling off when the display body D moves in a direction perpendicular to the display surface 4 (for example, in the forward direction of arrow CC) providing the step 13 to be almost parallel to the display surface 4 of the display body D (for example, in the direction of arrow AA).

[Exemplary Embodiment 2]

Exemplary Embodiment 2 of the present invention will be described with reference to FIGS. 8A to 8C.

Although the step 13 between the high friction surface 11A and the low friction surface 12A is formed to be almost parallel (in the direction of arrow AA) to the display surface 4 of the display body D in the friction surface 10A of Exemplary Embodiment 1, without being limited by this, a friction member 20 having a friction surface 20A as shown in FIGS. 8A, 8B, and 8C may also be used.

That is, the friction member 20 is a layered body configured to have a high friction member 21 which has a large size and is stacked on a lower surface 2A of a base 2 and a low friction member 22 which has a (relatively) smaller size (than the high friction member 21) and is stacked on the high friction member 21. Similarly to the friction surface 10A described above, the friction surface 20A of the friction member 20 includes a high friction surface 21A on the high friction member 21 having a relatively high friction coefficient and a low friction surface 22A on the low friction member 22 having a lower friction coefficient than that of the high friction surface. Moreover, the low friction surface 22A is configured to be more protruded downward (toward the support surface TA side) than the high friction surface 21A. In addition, the low friction surface 22A is positioned on the outward side from the high friction surface 21A and is provided in a corner and in the vicinity of an edge of the lower surface 2A of the base 2.

In addition, a linear step 23 is provided between the two friction surfaces configured to have the high friction surface 21A and the low friction surface 22A. The step 23 is disposed in two directions, one of which is a direction almost parallel to the display surface 4 of the display body D (in the direction of arrow AA) and another of which is a direction almost perpendicular to the display surface 4 of the display body D (in the direction of arrow BB). Accordingly, it is possible to prevent the display body from falling off when the display body D moves in a direction perpendicular to the display surface 4 (for example, in the forward direction of arrow CC). In addition, it is possible to prevent the falling off when the display body D moves in a direction along the display surface 4 (for example, lateral direction). In other words, it is possible to prevent the falling off when the display body D moves in the direction along the display surface 4 and the direction perpendicular to the display surface 4 by disposing the step 23 in two directions, one of which is a direction almost parallel to the display surface 4 of the display body D (in the direction of arrow AA) and another of which is a direction almost perpendicular to the display surface 4 of the display body D (in the direction of arrow BB).

[Exemplary Embodiment 3]

Exemplary Embodiment 3 of the present invention will be described with reference to FIGS. 9A and 9B.

Although the step 13 between the high friction surface 11A and the low friction surface 12A is formed to be a linear shape on the friction surface 10A of Exemplary Embodiment 1, without being limited by this, a friction member 30 having a friction surface 30A as shown in FIGS. 9A, and 9B may also be used.

That is, the friction member 30 is a layered body configured to have a (rectangular) high friction member 31 which has a large size and is stacked on a lower surface 2A of a base 2 and a (circular) low friction member 32 which has a (relatively) smaller size (than the high friction member 31) and is stacked on the high friction member 31. Similarly to the friction surface 10A described above, the friction surface 30A of the friction member 30 includes a high friction surface 31A on the high friction member 31 having a relatively high friction coefficient and a low friction surface 32A on the low friction member 32 having a lower friction coefficient than that of the high friction surface. Moreover, the low friction surface 32A is configured to protrudes downward from the high friction surface 31A.

A step 33 which is formed such that the low friction surface 32A overlaps on the high friction surface 31A (that is, the shape of the edge of the low friction surface 32A positioned on the high friction surface 31A) has a curved shape.

The curved step 33 is formed, for example, in a round shape in consideration of workability of the high friction member 31. In addition, without being limited by this, for example, as shown in FIGS. 6B and 7, the curved step 33 may be formed to match the shape of the edge of the desk T which is formed in a curved shape to make the high friction surface 31A which is at a position much lower than the low friction surface 32A come into easy contact with the support surface TA on the desk T, to thereby reliably prevent the display body D from falling off from the edge of the desk T, in a case where the display body D moves to the edge of the desk T and the low friction surface 32A is projected from the edge of the desk T.

[Exemplary Embodiment 4]

Exemplary Embodiment 4 of the present invention will be described with reference to FIGS. 10A and 10B.

Although the low friction surface 12A is stacked on the high friction surface 11A in the friction surface 10A of the Exemplary Embodiment 1, without being limited by this, a friction member 40 may be set to have a friction surface 40A as shown in FIGS. 10A and 10B.

The friction member 40 is configured to include a high friction member 41 having a high friction surface 41A and a low friction member 42 having a low friction surface 42A and all of the friction members 41 and 42 are disposed on the lower surface 2A of the base 2. Similarly to the friction surface 10A described above, the friction surface 40A of the friction member 40 includes a high friction surface 41A having a relatively high friction coefficient and a low friction surface 42A having a lower friction coefficient than that of the high friction surface. Moreover, the low friction surface 42A is configured to protrudes further downward than the high friction surface 41A (to a support surface TA side) through a step 43.

However, the friction surface 40A is not the layered body as shown in the above-described Exemplary Embodiments 1 to 3. As shown in FIGS. 10A and 10B, the low friction surface 42A is formed to be relatively greater in thickness than the high friction surface 41A and the low friction surface 42A and the high friction surface 41A are disposed at a position adjacent to each other. In addition, similarly to the above-described low friction surfaces 12A, 22A, and 32A, the low friction surface 42A is disposed on an outward side from the high friction surface 41A and in a corner and in the vicinity of an edge of the lower surface 2A of the base 2.

Moreover, similarly to other exemplary embodiments described above, in such a friction surface 40A in which the low friction surface 42A and the high friction surface 41A are adjacent to each other, the display body D is prevented from sliding on the support surface TA on the desk T due to the high friction surface 41A and the display body D can be reliably prevented from falling off from the edge of the desk T using the high friction surface 41A as a stopper.

[Exemplary Embodiment 5]

Exemplary Embodiment 5 of the present invention will be described with reference to FIGS. 11A and 11B.

Although the high friction surface 11A is disposed in the vicinity of the corner of the lower surface 2A of the base 2 and the low friction surface 12A is disposed on the upper surface of the high friction surface 11A in the friction surface 10A of the Exemplary Embodiment 1, without being limited by this, a friction surface 50A as shown in FIGS. 11A and 11B may also be used.

Similarly to the friction surface 10A described above, the friction surface 50A of Exemplary Embodiment 5 includes a high friction surface 51A having a relatively high friction coefficient and a low friction surface 52A having a lower friction coefficient than that of the high friction surface. Moreover, the low friction surface 52A is configured to protrudes downward from the high friction surface 51A (to a support surface TA side) through a step 53.

As shown in FIGS. 11A and 11B, the friction surface 50A is configured such that a lower surface 2A of a base 2 itself is formed with the high friction surface 51A and a low friction member 52 having the low friction surface 52A overlaps on the high friction surface 51A, and thus, the low friction surface 52A protrudes further downward (to a support surface TA side) than the high friction surface 51A. In addition, the low friction surface 52A is disposed on the high friction surface 51A and in a corner and in the vicinity of an edge of the base 2.

Moreover, similarly to other display apparatuses described above, in such a display apparatus 1 in which the lower surface 2A of the base 2 itself is formed with the high friction surface 51A and the low friction surface 52A is stacked on the high friction surface 51A, the display body D is prevented from sliding on the support surface TA on the desk T due to the high friction surface 51A and the display body D is prevented from falling off from the edge of the desk T using the high friction surface 51A as a stopper.

As shown in the above-described Exemplary Embodiments 1 to 5, it is possible to obtain a state where the low friction surfaces 12A, 22A, 32A, 42A, and 52A protrude downward from the high friction surfaces 11A, 21A, 31A, 41A, and 51A by having a configuration that the low friction surfaces 12A, 22A, and 33A are provided to overlap on the high friction surfaces 11A, 21A, and 31A (Exemplary Embodiments 1 to 3); that the low friction member 42 is formed to be relatively greater in thickness than the high friction member 41 and that the low friction surface 42A and the high friction surface 41A are disposed at a position adjacent to each other without overlapping each other (Exemplary Embodiment 4); or that the entire lower surface 2A of the base 2 is formed with the high friction surface 51A and the low friction surface 52A is provided to overlap on the high friction surface 51A (Exemplary Embodiment 5). That is, it is possible to realize a state where the low friction surfaces 12A, 22A, 32A, 42A, and 52A protrude from the high friction surfaces 11A, 21A, 31A, 41A, and 51A using various dispositions and formations of the high friction surface 11A and the low friction surface 12A.

As described above, exemplary embodiments of the present invention has been described with reference to the drawings, but the detailed configuration is not limited to these exemplary embodiments and the design of the configuration may be modified within the scope not departing from the gist of the present invention.

INDUSTRIAL APPLICABILITY

The present invention relates to technology, which is applied to a display apparatus, for preventing the display apparatus from falling off due to external force.

REFERENCE SYMBOLS

1 DISPLAY APPARATUS
2 BASE
2A LOWER SURFACE
4 DISPLAY SURFACE
5 DISPLAY MAIN BODY
10 FRICTION MEMBER
10A FRICTION SURFACE
11 HIGH FRICTION MEMBER
11A HIGH FRICTION SURFACE
12 LOW FRICTION MEMBER
12A LOW FRICTION SURFACE
13 STEP
20 FRICTION MEMBER
20A FRICTION SURFACE
21 HIGH FRICTION MEMBER
21A HIGH FRICTION SURFACE
22 LOW FRICTION MEMBER
22A LOW FRICTION SURFACE
23 STEP
30 FRICTION MEMBER
30A FRICTION SURFACE
31 HIGH FRICTION MEMBER
31A HIGH FRICTION SURFACE
32 LOW FRICTION MEMBER
32A LOW FRICTION SURFACE
33 STEP
40 FRICTION MEMBER
40A FRICTION SURFACE
41 HIGH FRICTION MEMBER
41A HIGH FRICTION SURFACE
42 LOW FRICTION MEMBER
42A LOW FRICTION SURFACE
43 STEP
50 FRICTION MEMBER
50A FRICTION SURFACE
51A HIGH FRICTION SURFACE
52 LOW FRICTION MEMBER
52A LOW FRICTION SURFACE
53 STEP
D DISPLAY MAIN BODY
T DESK
TA SUPPORT SURFACE

The invention claimed is:

1. A display apparatus, comprising:
a base which supports a display body on a support surface;
a high friction member fixed to a lower surface of the base, the high friction member including a high friction surface whose friction coefficient is relatively high; and
a low friction member fixed to and stacked on the high friction member, the low friction member including a low friction surface whose friction coefficient is lower than the friction coefficient of the high friction surface, and the low friction surface protruding toward the support surface than the high friction surface,
wherein the low friction surface is positioned at an outward side from the high friction surface and is provided closer to an edge of the lower surface of the base than the high friction surface, and
wherein the high friction surface comes into contact with the support surface in a state Where the low friction surface does not come into contact with the support surface; and
wherein, in corners of the base, the low friction member is stacked on the high friction member.

2. The display apparatus according to claim 1, wherein a linear step is provided between the low friction surface and the high friction surface.

3. The display apparatus according to claim 2, wherein the linear step is disposed such that a direction of the linear step is almost parallel to a display surface of the display body.

4. The display apparatus according to claim 2, wherein the linear step is disposed such that the direction of the linear step is almost perpendicular to the display surface of the display body.

5. The display apparatus according to claim 1, wherein a curved step is provided between the low friction surface and the high friction surface.

6. The display apparatus according to claim 1, wherein the low friction surface is provided to overlap on the high friction surface.

7. The display apparatus according to claim 6, wherein an entire lower surface of the base is formed with the high friction surface, and the low friction surface is provided to overlap on the high friction surface.

8. The display apparatus according to claim 1, wherein the low friction surface is formed to be relatively greater in thickness than the high friction surface, and the low friction surface and the high friction surface are disposed at a position adjacent to each other without overlapping each other.

9. The display apparatus according to claim 1, wherein, in a side view of the display apparatus, the low friction surface is disposed on a bottom surface of the high friction surface, and the high friction surface is disposed on the lower surface of the base.

10. The display apparatus according to claim 9, wherein, in a plan view of the display apparatus, a portion of the high friction surface overlaps with the low friction surface, and another portion of the high friction surface is exposed outside of the low friction surface.

11. The display apparatus according to claim 1, wherein a double-sided tape or an adhesive is configured to fix the high friction member to the lower surface of the base, and to fix the low friction member to the high friction member.

12. The display apparatus according to claim 1, wherein, in each corner of the base, the low friction member is stacked on the high friction member.

13. The display apparatus according to claim 1, wherein the low friction member and the high friction member are provided in each corner of the base.

14. A base of a display apparatus which supports a display body on a support surface, the base comprising:
 a high friction member fixed to a lower surface of the base, the high friction member including a high friction surface whose friction coefficient is relatively high; and
 a low friction member fixed to and stacked on the high friction member, the low friction member including a low friction surface whose friction coefficient is lower than the friction coefficient of the high friction surface, and the low friction surface protruding toward the support surface than the high friction surface,
 wherein the low friction surface is positioned at an outward side from the high friction surface and is provided closer to an edge of a lower surface of the base than the high friction surface, and
 wherein the high friction surface comes into contact with the support surface in a state where the low friction surface does not come into contact with the support surface; and
 wherein, in corners of the base, the low friction member is stacked on the high friction member.

15. The base according to claim 14, wherein the high friction surface is disposed on the lower surface of the base.

16. The base according to claim 14, wherein, in a side view of the display apparatus, the low friction surface is disposed on a bottom surface of the high friction surface, and the high friction surface is disposed on the lower surface of the base.

17. The base according to claim 14, wherein, in a plan view of the display apparatus, a portion of the high friction surface overlaps with the low friction surface, and another portion of the high friction surface is exposed outside of the low friction surface.

18. A method of producing a display apparatus, the method comprising:
 providing a base which supports a display body on a support surface;
 fixing a high friction member to a lower surface of the base, the high friction member including a high friction surface whose friction coefficient is relatively high; and
 fixing a low friction member to the high friction member so as to be stacked on the high friction member, the low friction member including a low friction surface whose friction coefficient is lower than the friction coefficient of the high friction surface, and the low friction surface protruding toward the support surface than the high friction surface,
 wherein said disposing the friction surface comprises positioning the low friction surface at an outward side from the high friction surface such that the low friction surface is provided closer to an edge of the lower surface of the base than the high friction surface, and
 wherein the high friction surface comes into contact with the support surface in a state where the low friction surface does not come into contact with the support surface; and
 wherein, in corners of the base, the low friction member is stacked on the high friction member.

19. A display apparatus, comprising:
 supporting means for supporting a display body on a support surface;
 high friction means fixed to a lower surface of the supporting means, the high friction means including a high friction surface whose friction coefficient is relatively high; and
 low friction means fixed to and stacked on the high friction means, the low friction means including a low friction surface whose friction coefficient is lower than the friction coefficient of the high friction surface, and the low friction surface protruding toward the support surface than the high friction surface,
 wherein the low friction surface is positioned at an outward side from the high friction surface and is provided closer to an edge of the lower surface of the supporting means than the high friction surface, and
 wherein the high friction surface comes into contact with the support surface in a state where the low friction surface does not come into contact with the support surface; and
 wherein, in corners of the base, the low friction member is stacked on the high friction member.

* * * * *